United States Patent
Akiyama et al.

(10) Patent No.: US 10,008,698 B2
(45) Date of Patent: *Jun. 26, 2018

(54) ORGANIC ELECTROLUMINESCENCE ELEMENT AND METHOD OF MANUFACTURING THE SAME

(71) Applicant: JOLED INC., Tokyo (JP)

(72) Inventors: Toshiyuki Akiyama, Tokyo (JP); Kaori Akamatsu, Osaka (JP)

(73) Assignee: JOLED INC., Tokyo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/966,322

(22) Filed: Dec. 11, 2015

(65) Prior Publication Data

US 2016/0172614 A1    Jun. 16, 2016

(30) Foreign Application Priority Data

Dec. 12, 2014 (JP) .................. 2014-251728

(51) Int. Cl.
*H01L 29/08* (2006.01)
*H01L 51/56* (2006.01)
*H01L 51/50* (2006.01)

(52) U.S. Cl.
CPC .......... *H01L 51/56* (2013.01); *H01L 51/5012* (2013.01); *H01L 2227/323* (2013.01); *H01L 2251/55* (2013.01)

(58) Field of Classification Search
CPC .......... H01L 2227/323; H01L 2251/55; H01L 51/5012; H01L 51/56

(Continued)

(56) References Cited

U.S. PATENT DOCUMENTS 6,278,236 B1 * 8/2001 Madathil ............. H01L 51/5092
                                                    313/504
6,483,236 B1 * 11/2002 Hung .................. H01L 51/5012
                                                    313/504

(Continued)

FOREIGN PATENT DOCUMENTS

JP    2000-100569    4/2000
JP    2001-196176    7/2001

(Continued)

OTHER PUBLICATIONS

U.S. Appl. No. 14/963,628 to Hideyuki Shirahase et al., filed Dec. 9, 2015.

(Continued)

*Primary Examiner* — Mohammed Shamsuzzaman
(74) *Attorney, Agent, or Firm* — Greenblum & Bernstein, P.L.C.

(57) ABSTRACT

An organic electroluminescence (EL) element including: an anode; a first functional layer above the anode, the first functional layer having at least one of a hole injection property and a hole transport property; a light-emitting layer above the first functional layer, the light-emitting layer including an organic light-emitting material doped with an electron donor material; a second functional layer above the light-emitting layer, the second functional layer having at least one of an electron injection property and an electron transport property; and a cathode disposed above the second functional layer, wherein carrier density of the light-emitting layer is from $10^{12}/cm^3$ to $10^{19}/cm^3$.

8 Claims, 13 Drawing Sheets

(58) Field of Classification Search
USPC .............. 257/40; 1/1; 252/301.16; 313/506
See application file for complete search history.

(56) References Cited

U.S. PATENT DOCUMENTS

| | | | |
|---|---|---|---|
| 9,559,327 B2* | 1/2017 | Yoneda | ............... H01L 51/5253 |
| 2004/0061136 A1 | 4/2004 | Tyan et al. | |
| 2004/0079923 A1* | 4/2004 | Yamazaki | ........... H01L 51/0025 |
| | | | 252/301.16 |
| 2005/0266218 A1 | 12/2005 | Peumans et al. | |
| 2006/0261333 A1 | 11/2006 | Murakami et al. | |
| 2009/0167159 A1 | 7/2009 | Song et al. | |
| 2011/0049498 A1 | 3/2011 | Hayashi et al. | |
| 2016/0141539 A1* | 5/2016 | Hoang | ................ H01L 51/5076 |
| | | | 257/40 |
| 2016/0172620 A1 | 6/2016 | Hashimoto et al. | |
| 2016/0172628 A1 | 6/2016 | Hashimoto et al. | |

FOREIGN PATENT DOCUMENTS

| | | |
|---|---|---|
| JP | 2002-313581 | 10/2002 |
| JP | 2011-023769 | 2/2011 |

OTHER PUBLICATIONS

U.S. Appl. No. 14/902,881 to Minh Hiep Hoang et al., filed Jan. 5, 2016.

Yoshihiro Iwasa and Taishi Takenobu, "Fundamental Lecture: <Basics and Application of Organic Molecular Electronics> Organic field-effect transistors," [Kiso Kouza: <Yuuki Bunshi Electronics no Kiso to Ohyou>: Yuuki Transistor], Oyo Buturi, vol. 77, No. 4, pp. 432-437 (2008), together with a partial English language translation.

Office Action from U.S. Patent and Trademark Office (USPTO) in U.S. Appl. No. 14/963,628, dated Jul. 12, 2017.

Office Action from U.S. Patent and Trademark Office (USPTO) in U.S. Appl. No. 14/963,628, dated Nov. 17, 2017.

* cited by examiner

ORGANIC ELECTROLUMINESCENCE ELEMENT AND METHOD OF MANUFACTURING THE SAME

This application is based on an application No. 2014-251728 filed in Japan, the contents of which are hereby incorporated by reference.

BACKGROUND OF THE DISCLOSURE (1) Technical Field

The present disclosure relates to organic electroluminescence (EL) elements that use EL of organic material, and methods of manufacturing organic EL elements.

(2) Description of Related Art

Organic EL elements are self-luminous and therefore have a high visibility. Further, organic EL elements are completely solid-state elements and therefore have excellent impact resistance. For these reasons and others, in recent years, the use of organic EL elements in display devices is becoming popular.

Organic EL elements have at least a light-emitting layer between a pair of electrodes (anode and cathode). In many cases, in addition to a light-emitting layer, organic EL elements are configured to have a functional layer for supplying electrons to the light-emitting layer (electron transport layer, electron injection layer), and a hole injection layer, hole transport layer, etc., between the light-emitting layer and the cathode. When driven, a voltage is applied between the pair of electrodes, and light is emitted as the result of recombination of holes injected to the light-emitting layer from the anode and electrons injected to the light-emitting layer from the cathode. Material development is being undertaken to achieve high-efficiency light-emitting properties and low-voltage drive properties for such organic EL elements. For example, JP 2002-313581 proposes an organic EL element that has a low drive voltage and high electron transport properties, by using alkali metal salts as a doping agent for the light-emitting layer.

However, conventional organic EL elements have low light emittance efficiency, due to an imbalance in the amount of electrons and the amount of holes injected to the light-emitting layer.

SUMMARY OF THE DISCLOSURE

In view of the above, the present disclosure aims to provide an organic EL element that increases light emittance efficiency by being driven by a low voltage.

In order to achieve this aim, one aspect of the present disclosure is an organic EL element comprising: an anode; a first functional layer disposed above the anode, the first functional layer having at least one property selected from the group consisting of a hole injection property and a hole transport property; a light-emitting layer disposed above the first functional layer, the light-emitting layer comprising an organic light-emitting material doped with an electron donor material; a second functional layer disposed above the light-emitting layer, the second functional layer having at least one property selected from the group consisting of an electron injection property and an electron transport property; and a cathode disposed above the second functional layer, wherein carrier density of the light-emitting layer is from $10^{12}/cm^3$ to $10^{19}/cm^3$.

Accordingly, the present disclosure achieves the aim of providing an organic EL element that increases light emittance efficiency by being driven by a low voltage.

BRIEF DESCRIPTION OF DRAWINGS

These and other objects, advantages and features of the technology pertaining to the present disclosure will become apparent from the following description thereof taken in conjunction with the accompanying drawings which illustrate at least one specific embodiment of the technology pertaining to the present disclosure. In the drawings:

FIG. 3A is a partial cross-section illustrating a state in which a TFT layer and an interlayer insulating layer are formed on a substrate. FIG. 3B is a partial cross-section illustrating a state in which pixel electrodes are formed on the interlayer insulating layer. FIG. 3C is a partial cross-section illustrating a state in which a bank material layer is formed on the interlayer insulating layer and the pixel electrodes.

FIG. 4A is a partial cross-section illustrating a state in which a bank layer is formed. FIG. 4B is a partial cross-section illustrating a state in which a hole injection layer is formed on the pixel electrodes in openings in the bank layer. FIG. 4C is a partial cross-section illustrating a state in which a hole transport layer is formed on the hole injection layer in openings in the bank layer.

FIG. 5A is a partial cross-section illustrating a state in which an organic light-emitting layer is formed on the hole transport layer in openings in the bank layer. FIG. 5B is a partial cross-section illustrating a state in which a first intermediate layer is formed on the organic light-emitting layer and the bank layer. FIG. 5C is a partial cross-section illustrating a state in which a second intermediate layer is formed on the first intermediate layer.

FIG. 6A is a partial cross-section illustrating a state in which a functional layer is formed on the second intermediate layer. FIG. 6B is a partial cross-section illustrating a state in which an opposing electrode is formed on the functional layer. FIG. 6C is a partial cross-section illustrating a state in which a sealing layer is formed on the opposing electrode.

DESCRIPTION OF THE EMBODIMENT

<Summary of Embodiments>

Figure 1:
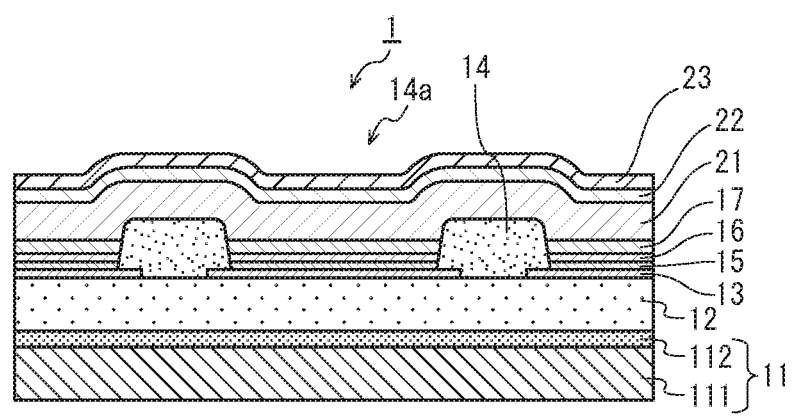
FIG. 1 is a cross-section illustrating a schematic configuration of an organic EL element 1 pertaining to an embodiment.

An organic electroluminescence (EL) element pertaining to the present embodiment is an organic EL element comprising: an anode; a first functional layer disposed above the anode, the first functional layer having at least one property selected from the group consisting of a hole injection property and a hole transport property; a light-emitting layer disposed above the first functional layer, the light-emitting layer comprising an organic light-emitting material doped with an electron donor material; a second functional layer disposed above the light-emitting layer, the second functional layer having at least one property selected from the group consisting of an electron injection property and an electron transport property; and a cathode disposed above the second functional layer, wherein carrier density of the light-emitting layer is from $10^{12}/cm^3$ to $10^{19}/cm^3$.

Another aspect may be configured so that the carrier density of the light-emitting layer is $1\times10^1$ to $1\times10^5$ times greater than carrier density of the organic light-emitting material prior to the doping with the electron donor material.

Another aspect may be configured so that the carrier density of the organic light-emitting material prior to the doping with the electron donor material is from $5\times10^{10}/cm^3$ to $5\times10^{14}/cm^3$.

Another aspect may be configured so that the electron donor material is an alkali metal or an alkaline earth metal.

Another aspect may be configured so that the electron donor material is lithium or sodium.

Further, a method of manufacturing the organic EL element pertaining to the present embodiment is a method comprising: forming an anode; forming a first functional layer above the anode, the first functional layer having at least one property selected from the group consisting of a hole injection property and a hole transport property; forming an organic light-emitting material layer above the first functional layer, the organic light-emitting material layer comprising an organic light-emitting material; forming a first intermediate layer above the organic light-emitting material layer, the first intermediate layer comprising a compound, the compound comprising a first metal that is an alkali metal or alkaline earth metal; forming a second intermediate layer above the first intermediate layer, the second intermediate layer comprising a second metal, the second metal having a property of decomposing a bond between the first metal and another element in the compound; forming a functional layer above the second intermediate layer, the functional layer having at least one property selected from the group consisting of an electron transport property and an electron injection property; and forming a cathode above the functional layer, wherein the forming of the second intermediate layer results in forming of a light-emitting layer by diffusion of the first metal into the organic light-emitting material layer, carrier density of the light-emitting layer being from $10^{12}/cm^3$ to $10^{19}/cm^3$.

Another aspect may be configured so that the first metal is lithium or sodium.

Another aspect may be configured so that the second metal is barium.

Another aspect may be configured so that the first intermediate layer is formed to have a film thickness of 1 nm to 10 nm.

Another aspect may be configured so that the second intermediate layer is formed to have a film thickness of 0.1 nm to 1 nm.

Another aspect may be configured so that the method comprises: forming an anode; forming a first functional layer above the anode, the first functional layer having at least one property selected from the group consisting of a hole injection property and a hole transport property; forming an organic light-emitting material layer above the first functional layer, the organic light-emitting material layer comprising an organic light-emitting material, and subsequently doping the organic light-emitting material layer with an alkali metal or an alkaline earth metal to form a light-emitting layer that has a carrier density of $10^{12}/cm^3$ to $10^{19}/cm^3$; forming a functional layer above the light-emitting layer, the functional layer having at least one property selected from the group consisting of an electron transport property and an electron injection property; and forming a cathode above the functional layer.

Another aspect may be configured so that the method comprises: forming an anode; forming a first functional layer above the anode, the first functional layer having at least one property selected from the group consisting of a hole injection property and a hole transport property; forming a light-emitting layer above the first functional layer, by co-evaporation of an organic light-emitting material and a selected one of the group consisting of an alkali metal and an alkaline earth metal, the light-emitting layer having a carrier density of $10^{12}/cm^3$ to $10^{19}/cm^3$; forming a functional layer above the light-emitting layer, the functional layer having at least one property selected from the group consisting of an electron transport property and an electron injection property; and forming a cathode above the functional layer.

<Embodiment>

1. Configuration of Organic EL Element

Configuration of the organic EL element 1 pertaining to the embodiment is described with reference to FIG. 1.

FIG. 1 is a cross-section enlargement of a portion of an organic EL panel 100 (see FIG. 2) that includes a plurality of the organic EL element 1, in other words a cross-section of a portion corresponding to one of the organic EL element 1 and a surrounding area. In the present embodiment, the one of the organic EL element 1 corresponds to one pixel (sub-pixel). The organic EL element 1 is a top-emission type so the upper side in FIG. 1 is a display surface of the organic EL element 1.

As in FIG. 1, the organic EL element 1 includes a substrate 11, an interlayer insulating layer 12, a pixel electrode 13, a bank layer 14, a hole injection layer 15 and hole transport layer 16 that compose a first functional layer, a light-emitting layer 17, a second functional layer 21, an opposing electrode 22, and a sealing layer 23. The substrate 11, the interlayer insulating layer 12, the second functional layer 21, the opposing layer 22, and the sealing layer 23 are not formed per pixel, but are formed across a plurality of the organic EL element 1 included in the organic EL panel 100.

(1) Substrate

The substrate 11 includes a base material 111 that is an insulating material and a thin film transistor (TFT) layer 112. Drive circuitry is formed for each pixel in the TFT layer 112. Glass, for example, may be used as a material from which the base material 111 is formed. As a glass material, specific examples include alkali-free glass, soda glass, non-fluorescent glass, phosphate glass, borate glass, silica glass, etc.

(2) Interlayer Insulating Layer

The interlayer insulating layer 12 is formed on the substrate 11. The interlayer insulating layer 12 is formed from a resin material, and is for flattening level differences of the upper surface of the TFT layer 112. As a resin material, a positive-type photosensitive material may be used, for example. As such a photosensitive material, acrylic resin, polyimide resin, siloxane resin, phenolic resin may be used, for example. Although not illustrated in FIG. 1, a contact hole is formed in the interlayer insulating layer for each pixel.

(3) Pixel Electrode

The pixel electrode 13 is formed from a conductive material and formed on the interlayer insulating layer 12. The pixel electrode 13 is provided one-to-one to each pixel, and is electrically connected to the TFT layer 112 via a contact hole. In the present embodiment, the pixel electrode 13 functions as an anode, and because the organic EL element is top-emission, the pixel electrode 13 may be formed from a conductive material that has light-reflectivity. As a conductive material that has light-reflectivity, metal may be used. Specifically, silver (Ag), aluminium (Al), aluminium alloy, molybdenum (Mo), silver palladium copper alloy (APC), silver rubidium gold alloy (ARA), molybdenum and chromium alloy (MoCr), molybdenum and tungsten alloy (MoW), nickel and chromium alloy (NiCr), etc., may be used.

Further, in the case of a bottom-emission type, the pixel electrode 13 may be light transmissive. As a conductive material that is light transmissive, indium tin oxide (ITO), indium zinc oxide (IZO), zinc oxide (ZnO), etc., may be used.

(4) Bank Layer

The bank layer 14 is formed on the pixel electrode 13 to expose an area of the upper surface of the pixel electrode 13 and cover a surrounding area. An area of the upper surface of the pixel electrode 13 not covered by the bank layer 14 (hereafter, "opening") corresponds to a sub-pixel. In other words, the bank layer 14 has an opening 14a for each sub-pixel.

In the present embodiment, a portion of the bank layer 14 in which the pixel electrode 13 is not formed is formed on the interlayer insulating layer 12. In other words, a bottom surface of a portion of the bank layer 14 in which the pixel electrode 13 is not formed is in contact with the interlayer insulating layer 12.

The bank layer 14 is formed from, for example, an insulative organic material (for example, acrylic resin, polyimide resin, novolac resin, phenolic resin, etc.). The bank layer 14 functions as a structure for preventing ink overflowing when the light-emitting layer 17 is formed by a coating method, and functions as a structure for mounting a deposition mask when the light-emitting layer 17 is formed by a vapor deposition method. In the present embodiment, the bank layer 14 is formed from a resin material, and, for example, a positive-type photosensitive material may be used as the material of the bank layer 14. As such a photosensitive material, acrylic resin, polyimide resin, siloxane resin, or phenolic resin may be used. In the present embodiment, phenolic resin is used.

(5) Hole Injection Layer

The hole injection layer 15 is disposed in the opening 14a above the pixel electrode 13, for the purpose of accelerating injection of holes from the pixel electrode 13 to the light-emitting layer 17. The hole injection layer 15 is a layer composed of an oxide of silver (Ag), molybdenum (Mo), chromium (Cr), vanadium (V), tungsten (W), nickel (Ni), iridium (Ir), etc., or a semiconducting polymer material such as poly(3,4-ethylenedioxythiophene) polystyrene sulfonate (PEDOT:PSS). Among the above materials, the hole injection layer 15 made from metal oxide has a function of injecting holes into the light-emitting layer 17 by stabilizing holes and assisting in hole generation, and has a large work function. In the present embodiment, the hole injection layer 15 is made from an electrically conductive polymer material such as PEDOT:PSS.

When the hole injection layer 15 is configured from a transition metal oxide, a plurality of oxidation numbers can be achieved and therefore a plurality of energy levels can be obtained. As a result, hole injection becomes easier and drive voltage can be reduced.

(6) Hole Transport Layer

The hole transport layer 16 is formed in the opening 14a by using a polymer compound having no hydrophilic group. For example, a polymer compound having no hydrophilic group may be used such as polyfluorene and derivatives thereof, or polyarylamine and derivatives thereof, etc.

The hole transport layer 16 has a function of transporting holes injected from the hole injection layer 15 to the light-emitting layer 17.

In the present embodiment, the hole injection layer 15 and the hole transport layer 16 compose the first functional layer.

(7) Light-emitting Layer

The light-emitting layer 17 is formed in the opening 14a. The light-emitting layer 17 has a function of emitting red (R), green (G), or blue (B) light by recombination of holes and electrons. The light-emitting layer 17 is formed by adding a metal as an electron donor material to an organic light-emitting material layer composed of an organic light-emitting material.

As the organic light-emitting material used in the light-emitting layer 17, known materials may be used. For example, a known phosphor may be used such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group 3 metal, metal complex of oxine, fluorescent substance of a rare earth complex or similar, or metal complex emitting phosphorescence such as tris(2-phenylpyridine)iridium.

As the electron donor material added to the organic light-emitting material, an alkali metal or alkaline earth metal may be used. Specifically, for example, a low work function metal may be used such as lithium, barium, calcium, potassium, cesium, sodium, or rubidium. From this list, lithium and sodium are preferred.

The doping concentration of the electron donor material added to the light-emitting layer 17 is configured to shift the energy level of the light-emitting layer 17 in a positive direction in a range from 0.05 eV to 0.3 eV from a base energy level in a state in which the electron donor material is not included. In this case, carrier density of the light-emitting layer 17 is configured to be in a range from $10^{12}/cm^3$ to $10^{19}/cm^3$.

Further, in the light-emitting layer 17, a metal acting as the electron donor material is distributed to be dispersed throughout the organic light-emitting material layer in a thickness direction thereof. Details of doping concentration of the electron donor material are described later.

(8) Second Functional Layer

The second functional layer 21 is formed above a second intermediate layer 19 and has a function of transporting electrons injected from the opposing electrode 22 to the light-emitting layer 17. In the present embodiment, the second functional layer 21 is an electron transport layer and is formed by doping an organic material with a metal. As an organic material used in the second functional layer 21, for example, a π electron system low molecular weight organic material may be used such as oxadiazole derivative (OXD), triazole derivative (TAZ), phenanthroline derivative (BCP, Bphen), etc. As a metal used for doping the organic material, an alkali metal or an alkaline earth metal may be used. More specifically, for example: a low work function metal such as lithium, barium, calcium, potassium, cesium, sodium, or rubidium; a low work function metal salt such as lithium fluoride; a low work function metal oxide such as barium oxide; a low work function metal-organic complex such as a complex between lithium and quinolinol; etc., may be used.

(9) Opposing Electrode

The opposing electrode 22 is disposed across all the sub-pixels, and is formed from a light-transmissive material that has conductivity, such as, for example, indium tin oxide (ITO), indium zinc oxide (IZO), etc. In the present embodiment, the opposing electrode 22 functions as a cathode.

(10) Sealing Layer

The sealing layer 23 is disposed above the opposing electrode 22 and has an aim of preventing degradation of the light-emitting layer 17 caused by contact with moisture, oxygen, etc. Because the organic EL panel 100 is a top-emission type, material of the sealing layer 23 is a selected light-transmissive material such as, for example, silicon nitride (SiN), silicon oxynitride (SiON), etc.

(11) Other

Although not illustrated in FIG. 1, a color filter and/or upper substrate may be disposed above and joined to the sealing layer 23. According to disposing/joining of the upper substrate, the hole transport layer 16, the light-emitting layer 17, and the second functional layer 21 may be protected from moisture, oxygen, etc.

2. Overall Structure of Organic EL Display Device

Figure 2:
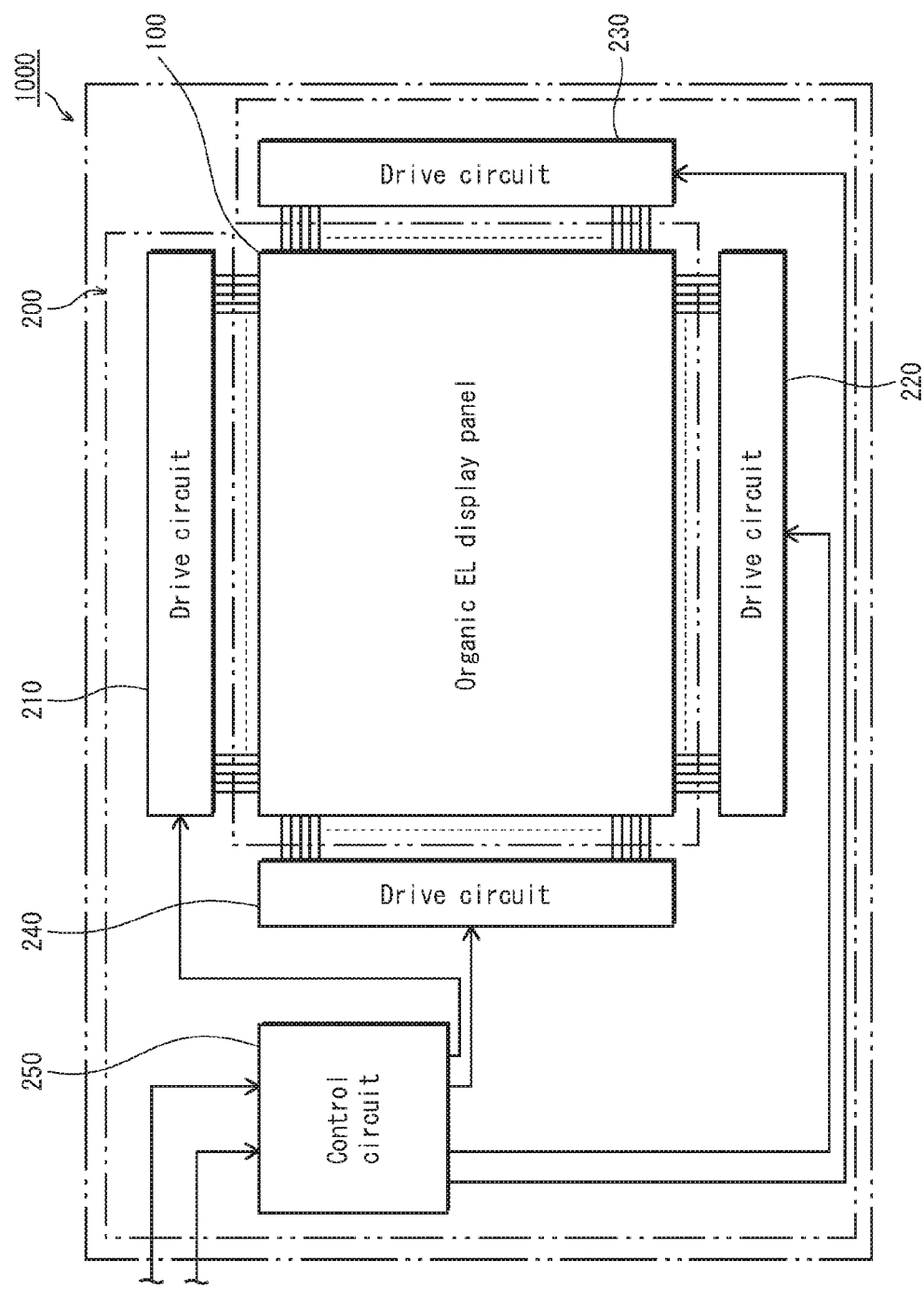
FIG. 2 is a block diagram illustrating a configuration of an organic EL display device 1000 including the organic EL element 1.

FIG. 2 is a schematic block diagram illustrating configuration of an organic EL display device 1000 comprising the organic EL panel 100 that comprises a plurality of the organic EL element 1. As illustrated in FIG. 2, the organic EL display device 1000 comprises the organic EL panel 100 and a drive controller 200 connected to the organic EL panel 100. The organic EL panel 100 is a display panel using the EL phenomenon of organic material, and a plurality of the organic EL element 1 are, for example, arranged in a matrix. The drive controller 200 comprises four drive circuits 210-240 and a control circuit 250.

Disposition of the drive controller 200 relative to the organic EL panel 100 in the organic EL display device 1000 is not limited to this example.

3. Method of Manufacturing Organic EL Element

The method of manufacturing the organic EL element 1 pertaining to the embodiment is described below with reference to FIG. 3A through FIG. 7. FIG. 3A through FIG. 6C are cross-sections schematically illustrating a process of manufacturing the organic EL element 1, and FIG. 7 is a schematic process diagram illustrating the process of manufacturing the organic EL element 1.

Figure 3A:
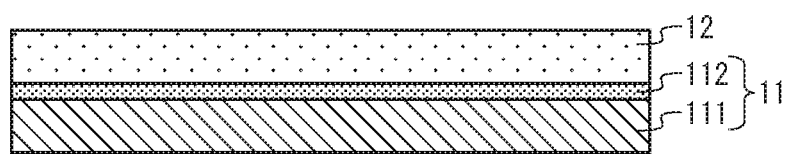
FIG. 3A, FIG. 3B, and FIG. 3C are partial cross-sections illustrating a schematic configuration of part of a process of manufacturing the organic EL element 1.
Figure 7:
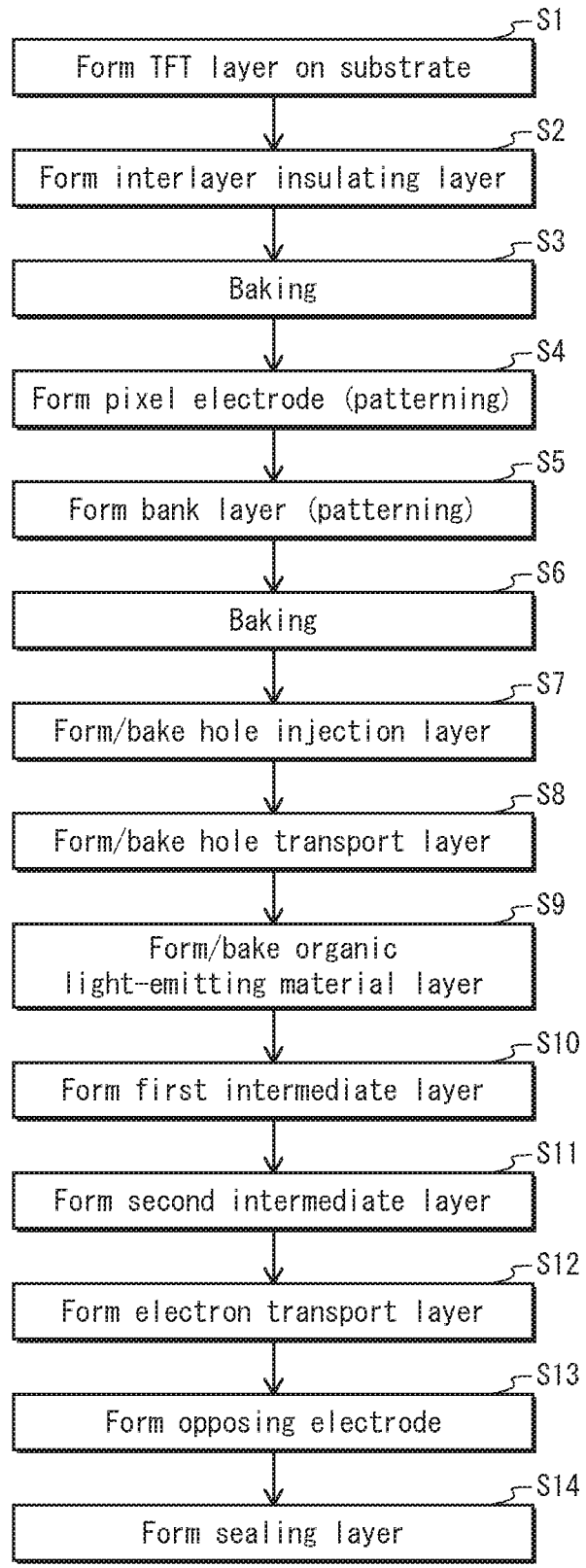
FIG. 7 is a schematic process diagram illustrating a process of manufacturing the organic EL element 1.

First, as illustrated in FIG. 3A, the TFT layer 112 is deposited above the base material 111, forming the substrate 11 (step S1 in FIG. 7), and the interlayer insulating layer 12 is deposited above the substrate 11 (step S2 in FIG. 7). In the present embodiment, acrylic resin that is a positive-type photosensitive material is used as interlayer insulating layer resin, which is a material of the interlayer insulating layer 12. The interlayer insulating layer 12 is formed by interlayer insulating layer solution being applied onto the substrate 11. The interlayer insulating layer solution is acrylic resin (interlayer insulating layer resin) dissolved in interlayer insulating layer solvent (for example PGMEA). Subsequently, baking is performed (step S3 in FIG. 7). Baking is performed at a temperature from 150° C. to 210° C. for 180 minutes.

Figure 3B:
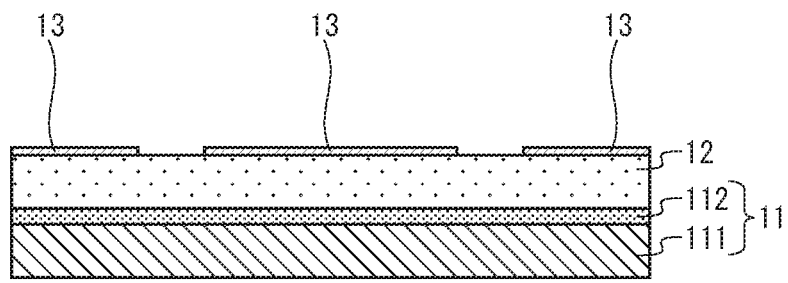

As illustrated in FIG. 3B, based on vacuum deposition or sputtering, the pixel electrode 13 comprising a metal material and having a thickness of approximately 150 nm is formed for each sub-pixel (step S4 in FIG. 7).

Figure 3C:
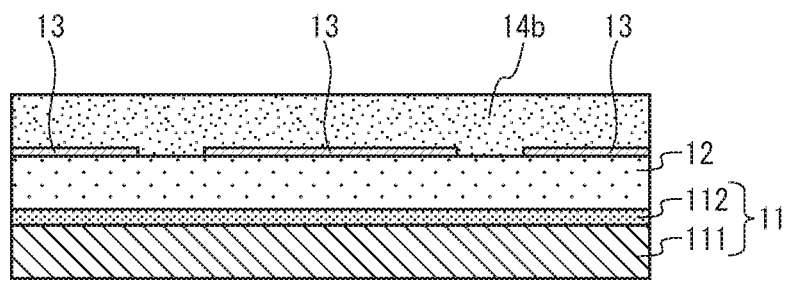

Next, bank layer resin, which is a material of the bank layer 14, is applied on the pixel electrode 13, forming a bank material layer 14b (FIG. 3C). For example, phenolic resin, which is a positive-type photosensitive material, is used as bank layer resin. The bank material layer 14b is formed by using a spin coating method or similar to uniformly apply, onto the pixel electrode 13, a solution of phenolic resin, which is bank layer resin, dissolved in a solvent (for example, a mixed solvent of ethyl lactate and GBL).

Subsequently, the bank layer 14 is formed by performing pattern exposure and development of the bank material layer 14b (FIG. 4A, step S5 in FIG. 7), and the bank layer 14 is baked (step S6 in FIG. 7). As a result, the opening 14a is defined, which is a region for formation of the light-emitting layer 17. Baking of the bank layer 14 is performed, for example, at a temperature from 150° C. to 210° C. for 60 minutes.

Further, in the process of forming the bank layer 14, plasma treatment, or surface treatment according to a predefined alkaline solution, water, organic solvent, etc., may be performed on a surface of the bank layer 14. This treatment is performed with an aim of adjusting a contact angle of the bank layer 14 with respect to ink (solution) applied to the opening 14a, or an aim of providing water repellency to the surface.

Figure 4A:
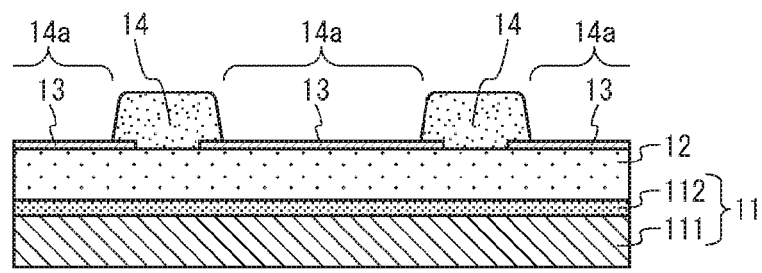
FIG. 4A, FIG. 4B, and FIG. 4C are partial cross-sections illustrating a schematic configuration of part of a process of manufacturing the organic EL element 1.
Figure 4B:
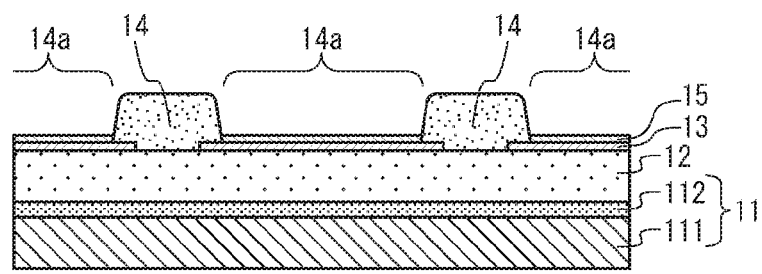

As illustrated in FIG. 4B, the hole injection layer 15 is deposited according to mask vapor deposition or application via inkjet, and baked (step S7 in FIG. 7).

Figure 4C:
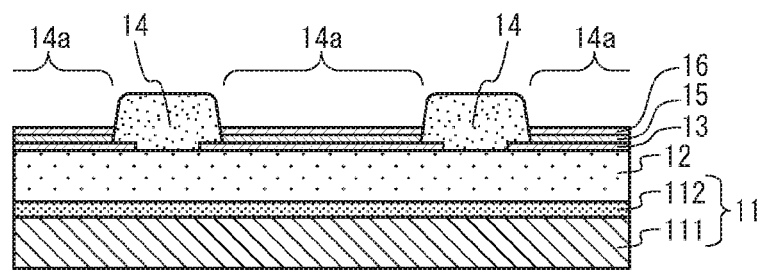

Subsequently, as illustrated in FIG. 4C, ink containing material of the hole transport layer 16 is applied to the opening 14a, which is defined by the bank layer 14, and baking (drying) of the ink forms the hole transport layer 16 (step S8 in FIG. 7).

In the present embodiment, the hole injection layer 15 and the hole transport layer 16 compose the first functional layer.

Figure 5A:
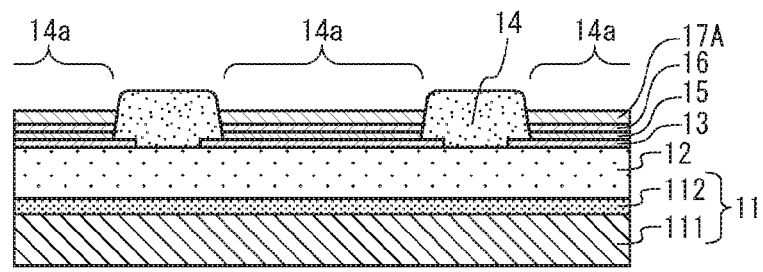
FIG. 5A, FIG. 5B, and FIG. 5C are partial cross-sections illustrating a schematic configuration of part of a process of manufacturing the organic EL element 1.

In a similar way, as illustrated in FIG. 5A, an organic light-emitting material layer 17A is formed by application and baking (drying) of ink containing organic light-emitting material that is a material of the light-emitting layer 17 (step S9 in FIG. 7).

Figure 5B:
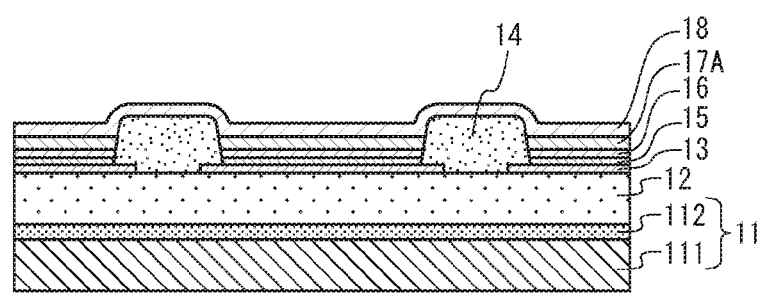

Continuing, as illustrated in FIG. 5B, a first intermediate layer 18 is formed above the organic light-emitting material layer 17A and the bank layer 14 by a process such as vacuum deposition, to have a film thickness from 1 nm to 10 nm, for example 4 nm (step S10 in FIG. 7). The first intermediate layer 18 is a layer for preventing impurities in or on the organic light-emitting material layer 17A, the hole transport layer 16, the hole injection layer 15, and the bank layer 14 from entering the second functional layer 21 and the opposing electrode 22. Accordingly, the first intermediate layer 18 includes a material having an impurity blocking property. Further, material of the first intermediate layer 18 diffuses into the organic light-emitting material layer 17A to form the light-emitting layer 17, and in the light-emitting layer 17 has a property of functioning as an electron donor material. Thus, material used in the first intermediate layer 18 is required to have an impurity blocking property and a property of functioning as an electron donor material in the light-emitting layer 17. Specifically, for example, an alkali metal compound or alkaline earth metal compound may be used, and more specifically, sodium fluoride (NaF) is used in the present embodiment. In the present embodiment, an alkali metal or alkaline earth metal included in the first intermediate layer 18 is referred to as a first metal. In the present embodiment, the first intermediate layer 18 is formed to have a film thickness of 4 nm.

Figure 5C:
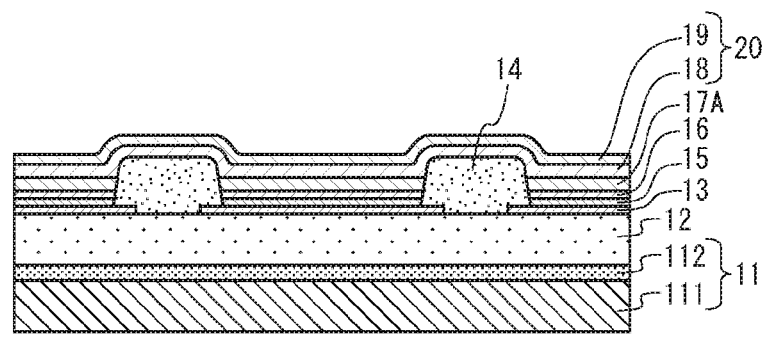

As illustrated in FIG. 5C, the second intermediate layer 19 is formed above the first intermediate layer 18 by vacuum deposition or similar, to have a film thickness from 0.1 nm to 1 nm, for example 1 nm (step S11 in FIG. 7). The second intermediate layer 19 includes a metal (hereafter, "second metal") that decomposes a bond between the first metal and another element in the first metal compound included in the first intermediate layer. As the second metal, for example, an alkali metal or alkaline earth metal is used. In the present embodiment, the second metal is barium (Ba). In the present embodiment, the second intermediate layer 19 is formed to have a film thickness of 1 nm.

The first intermediate layer 18 and the second intermediate layer 19 form an intermediate layer 20. As described above, film thickness of the first intermediate layer 18 and the second intermediate layer 19 is thin, the first metal in the first intermediate layer 18 and the second metal in the second intermediate layer 19 diffuse into the organic light-emitting material layer 17A in the manufacturing process, and organic light-emitting material mixes with at least the first metal to form the light-emitting layer 17. During the manufacturing process, in the light-emitting layer 17, at least the first metal, as an electron donor material, diffuses throughout the organic light-emitting material layer 17A in a thickness direction thereof.

As described above, the second metal is a metal that decomposes a bond between the first metal and another element in the first metal compound, and therefore decomposes bonds between the first metal and fluorine so that the first metal diffuses into the light-emitting layer 17 as ions. Accordingly, after completion of the process of manufacturing the organic EL element 1 (FIG. 7), outer edges of the first intermediate layer 18 and the second intermediate layer 19 are not clearly defined. In the light-emitting layer 17, at least the first metal, as an electron donor material, is distributed throughout the light-emitting layer 17 in a thickness direction thereof.

Ions of the first metal diffused in the light-emitting layer 17 function as an electron donor material in the light-emitting layer 17. Concentration of ions of the first metal in the light-emitting layer 17 can be adjusted by controlling film thickness during film formation of the first intermediate layer 18. When film thickness of the first intermediate layer 18 is thick, concentration of ions of the first metal as electron donor material in the light-emitting layer 17 increases, and when film thickness is thin, concentration decreases.

Figure 6A:
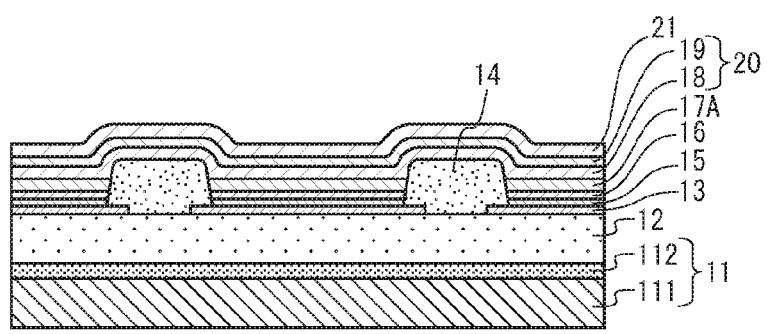
FIG. 6A, FIG. 6B, and FIG. 6C are partial cross-sections illustrating a schematic configuration of part of a process of manufacturing the organic EL element 1.

Subsequently, as illustrated in FIG. 6A, material of the second functional layer 21 forms, based on vacuum deposition, the second functional layer 21 above the second intermediate layer 19 (step S12 in FIG. 7).

Figure 6B:
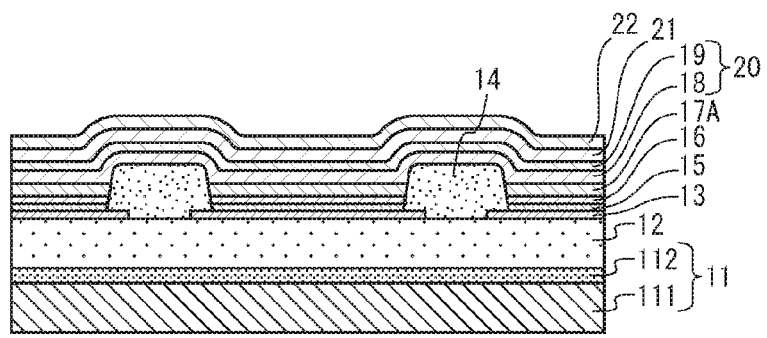

Continuing, as illustrated in FIG. 6B, material such as ITO, IZO, etc., is used to form the opposing electrode 22 above the second functional layer 21, according to a method such as vacuum deposition, sputtering, etc., (step S13 in FIG. 7).

Figure 6C:
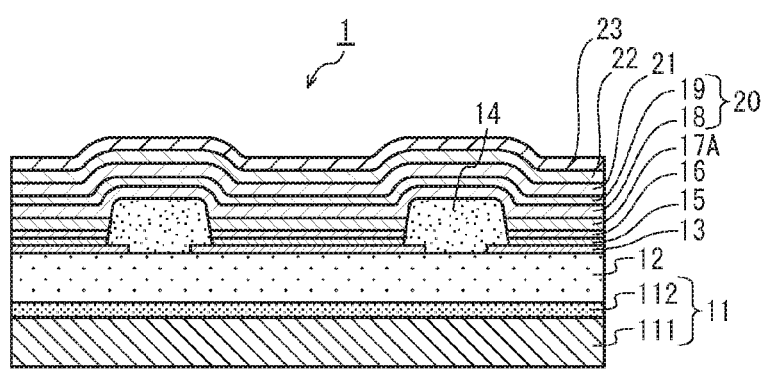

As illustrated in FIG. 6C, light-transmissive material such as SiN, SiON, etc., is used to form the sealing layer 23 above the opposing electrode 22, according to a method such as sputtering, CVD, etc., (step S14 in FIG. 7).

According to the process above, the organic EL element 1 and the organic EL panel 100 comprising the organic EL element 1 is completed. Note that a color filter and/or upper substrate may be disposed above and joined to the sealing layer 23.

4. Optimization of Carrier Movement between the Light-emitting Layer and Adjacent Layers A method for optimizing carrier movement between the light-emitting layer and the adjacent electron transport layer and hole transport layer in the organic EL element 1 is described with reference to the drawings.

Figure 8:
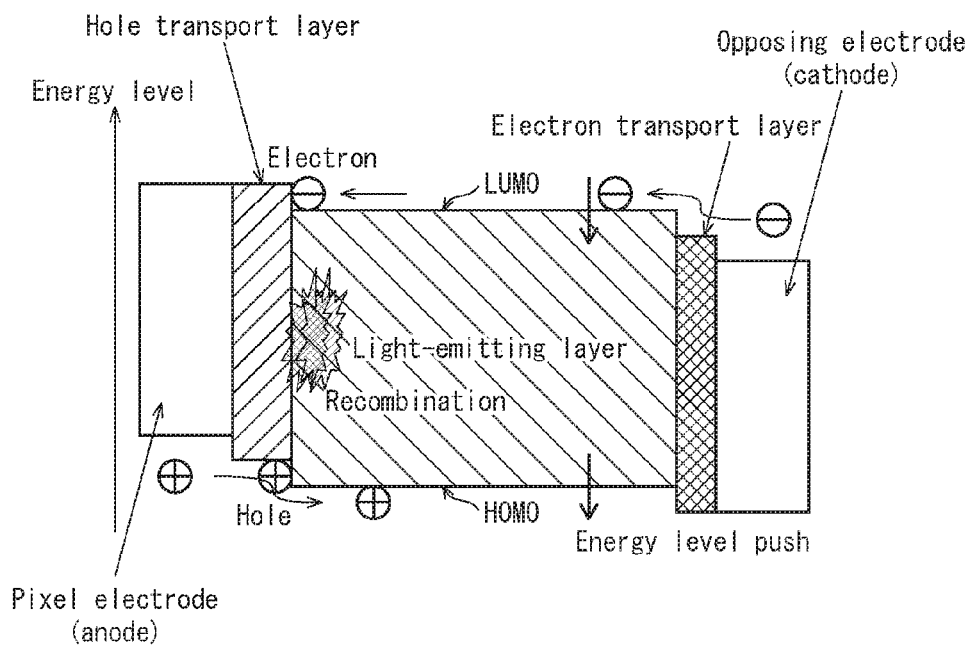
FIG. 8 is a schematic illustrating a state in which energy levels of the hole transport layer, the light-emitting layer, and the electron transport layer of the organic EL element 1 are appropriately balanced.

FIG. 8 is a schematic illustrating a state in which energy levels of the hole transport layer, the light-emitting layer, and the electron transport layer of the organic EL element are appropriately balanced. As illustrated in FIG. 8, in a state in which voltage is biased between the pixel electrode (anode) and the opposing electrode (cathode), holes are provided to the highest occupied molecular orbital (HOMO) of the light-emitting layer from the pixel electrode, via the hole transport layer. Electrons are supplied to the lowest unoccupied molecular orbital (LUMO) from the opposing electrode, via the electron transport layer. Holes supplied from the hole transport layer side and electrons supplied from the electron transport layer side recombine in the light-emitting layer, generating an excited state and causing light emission. Study by the inventors revealed that recombination of holes and electrons primarily occurs in the light-emitting layer in the vicinity of the boundary between the light-emitting layer and the hole transport layer.

In this recombination, when electrons and holes injected into the light-emitting layer are balanced quantitatively, electrons and holes are recombined without any excess or shortage. Thus, residual holes or electrons are not generated, all holes and electrons contribute to light emission, and optimization of light emittance efficiency of the organic EL element can be achieved.

Figure 9:
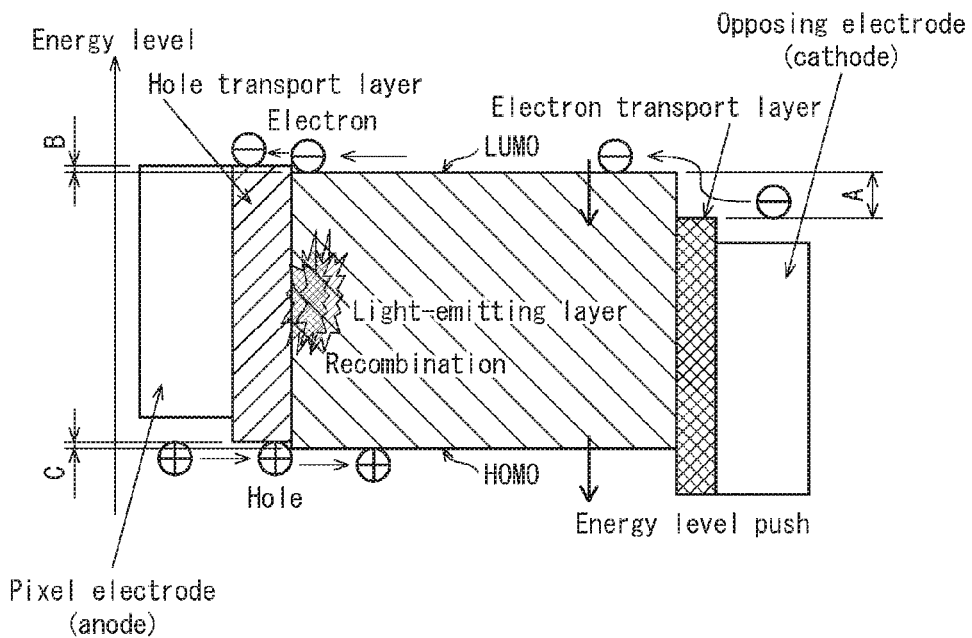
FIG. 9 is a schematic illustrating a state in which energy levels of the hole transport layer, the light-emitting layer, and the electron transport layer of the organic EL element 1 are not appropriately balanced.

In contrast, in a case in which energy levels of the hole transport layer, the light-emitting layer, and the electron transport layer are not appropriately balanced, appropriate carrier movement to the light-emitting layer does not occur. FIG. 9 is a schematic illustrating an example state in which energy levels of the hole transport layer, the light-emitting layer, and the electron transport layer of the organic EL element 1 are not appropriately balanced. In FIG. 9, energy level of the light-emitting layer, relative to energy levels of the hole transport layer and the electron transport layer, is higher than in the state illustrated in FIG. 8. Thus, LUMO level of the light-emitting layer relative to energy level of the electron transport layer is shifted upward, and a difference A between the energy levels is increased relative to the state illustrated in FIG. 8. As a result, in a state in which voltage is biased between the pixel electrode and the opposing electrode, an energy barrier to electron supply from the opposing electrode to the LUMO of the light-emitting layer, via the electron transport layer, is increased, and an amount of electrons flowing into the light-emitting layer is decreased.

Further, a difference B between energy level of the hole transport layer and LUMO level of the light-emitting layer is decreased, relative to the state illustrated in FIG. 8. As a result, an energy barrier to electron flow from the LUMO of the light-emitting layer to the hole transport layer is decreased, and an amount of electrons flowing from the light-emitting layer to the hole transport layer increases. Further, an amount of holes flowing into the light-emitting layer from the hole transport layer is increased.

On the other hand, HOMO level of the light-emitting layer relative to energy level of the hole transport layer is shifted downward, and a difference C between the energy levels is decreased relative to the state illustrated in FIG. 8. As a result, in a state in which voltage is biased between the pixel electrode and the opposing electrode, an amount of holes flowing from the pixel electrode to the HOMO of the light-emitting layer, via the hole transport layer, is increased.

As a result, a quantitative imbalance occurs between electrons and holes in the light-emitting layer, an amount of electrons that recombine with holes in the light-emitting layer to contribute to light emission is decreased relative to an amount of holes supplied to the light-emitting layer, causing a problem of reduction in light emittance efficiency of the organic EL element.

Figure 10A:
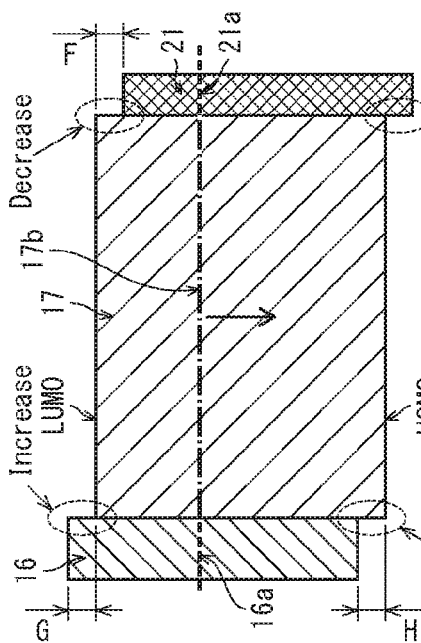
FIG. 10A, FIG. 10B, and FIG. 10C are schematics for describing energy levels of a hole transport layer 16, a light-emitting layer 17, and an electron transport layer 21 of the organic EL element 1.
Figure 10B:
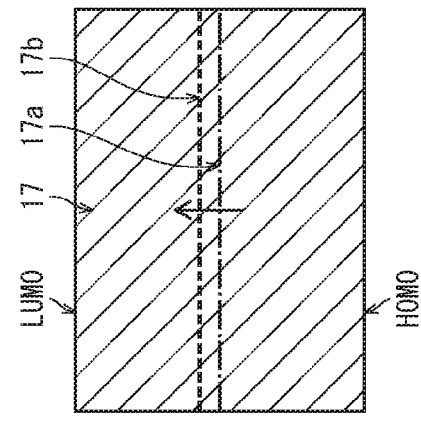
Figure 10C:
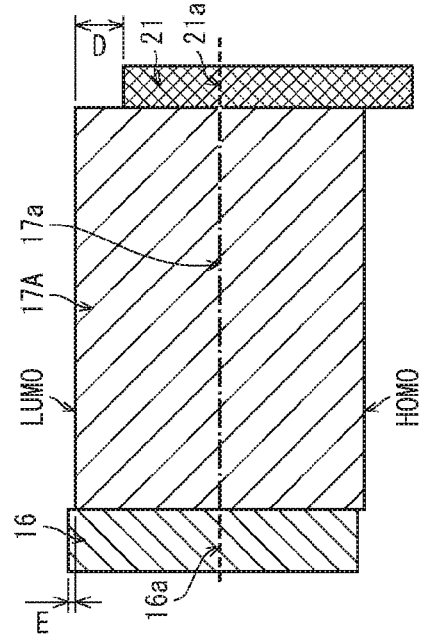

FIG. 10A, FIG. 10B, and FIG. 10C are schematics for describing energy levels of the hole transport layer 16, the light-emitting layer 17, and the electron transport layer 21 of the organic EL element 1. FIG. 10A illustrates energy levels of each layer prior to addition of the electron donor material to the light-emitting layer 17; FIG. 10B illustrates a Fermi level of the light-emitting layer 17 when the electron donor material is added to the light-emitting layer 17; and FIG. 10C illustrates energy levels of each layer after addition of the electron donor material to the light-emitting layer 17.

As illustrated in FIG. 10A, energy levels of the hole transport layer 16, the light-emitting layer 17, and the electron transport layer 21 are positioned so that respective Fermi levels 16a, 17a, and 21a match each other. In a case in which the light-emitting layer 17 of the organic EL element 1 does not include the electron donor material (FIG. 10A), a difference D between energy level of the electron transport layer 21 and LUMO level of the light-emitting layer 17 is relatively large, and a difference E between energy level of the hole transport layer 16 and LUMO level of the light-emitting layer 17 is relatively small. As a result, as illustrated in FIG. 9, an amount of electrons supplied for light emittance by recombination with holes in the light-emitting layer 17 is less than an amount of holes supplied to the light-emitting layer 17, and a technical problem of low light emittance efficiency occurs.

By adding the electron donor material to the light-emitting layer 17, Fermi level of the light-emitting layer 17 shifts towards LUMO, from 17a to 17b (FIG. 10B).

Thus, as illustrated in FIG. 10C, energy levels of each layer are re-positioned to energy levels to match the Fermi levels 16a, 17a, and 21a of each layer; and, compared to FIG. 10A, a difference F between energy level of the electron transport layer 21 and LUMO level of the light-emitting layer 17 decreases, and a difference G between energy level of the hole transport layer 16 and LUMO level of the light-emitting layer 17 increases. Thus, along with an increase in an amount of electrons flowing from the electron transport layer 21 to the light-emitting layer 17, an amount of electrons flowing from the light-emitting layer 17 to the hole transport layer 16 decreases and an amount of electrons within the light-emitting layer increases. As a result, an amount of electrons recombining with holes and contributing to light emission in the light-emitting layer increases, improving light emittance efficiency of the organic EL element 1.

Thus, by shifting Fermi level of the light-emitting layer 17 towards LUMO, an amount of electrons contributing to recombination with holes in the light-emitting layer 17 can be balanced with an amount of holes supplied from the hole transport layer 16 to the light-emitting layer 17, all holes and electrons can contribute to light emission without excess or shortage, and therefore light emittance efficiency of the organic EL element can be improved.

In other words, by controlling HOMO level and LUMO level of the light-emitting layer 17 by including the electron donor material in the light-emitting layer 17, input energy barriers between the light-emitting layer 17 and the electron transport layer 21 and the hole transport layer 16 are optimized. Thus, quantitative balance between electrons and holes injected into the light-emitting layer 17 can be optimized and light emittance efficiency can be improved.

Figure 11:
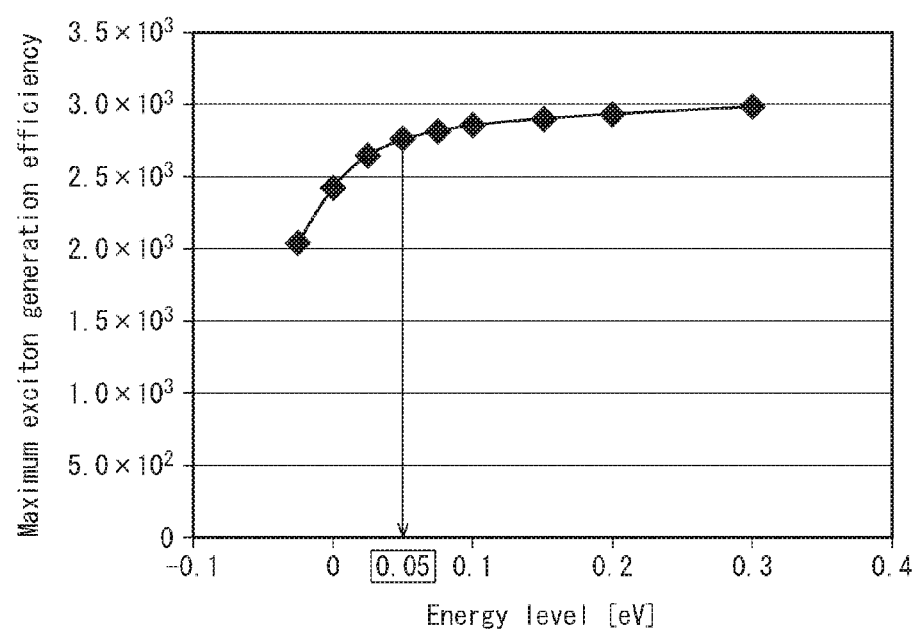
FIG. 11 shows simulation results illustrating a relationship between shift amount of the energy level of the light-emitting layer and maximum exciton efficiency in the organic EL element 1.
Figure 12:
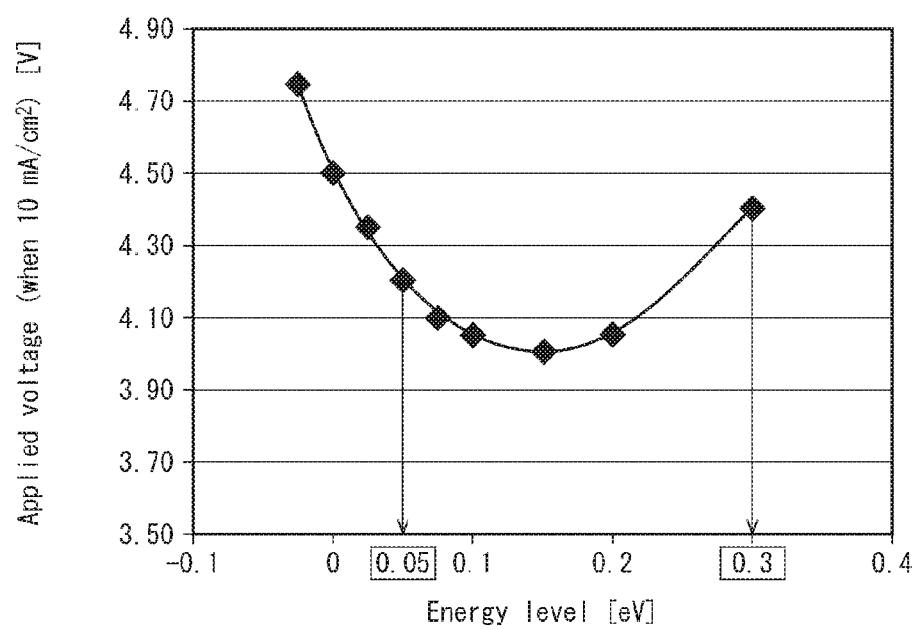
FIG. 12 shows simulation results illustrating a relationship between shift amount of the energy level of the light-emitting layer and applied voltage required per unit of current in the organic EL element 1.

5. Relationship between Shift Amount of Energy Level of the Light-emitting Layer 17, Light Emittance Efficiency, and Applied Voltage Shift amount of energy level of the light-emitting layer 17, light emittance efficiency, and applied voltage in the organic EL element 1 are described with reference to the drawings. Computational experiments varying energy levels indicating HOMO level and LUMO level of the light-emitting layer 17 were performed by using a device simulator. In the simulator, HOMO/LUMO levels of the light-emitting layer 17 in the model illustrated in FIG. 8 were varied, and current properties and efficiency properties were evaluated. FIG. 11 shows simulation results illustrating a relationship between shift amount of the energy level of the light-emitting layer and maximum exciton efficiency in the organic EL element 1. FIG. 12 shows simulation results illustrating a relationship between shift amount of the energy level of the light-emitting layer and applied voltage required per unit of current (applied voltage for 10 mA/cm$^2$). In FIG. 11 and FIG. 12, shift amount of energy level of the light-emitting layer assumes a state in which the light-emitting layer 17 does not include the donor electron material (the organic light-emitting material layer 17A) as a reference value (0 eV).

As shown in FIG. 11, exciton generation efficiency, which is an index of light emittance efficiency, increases as energy level of the light-emitting layer 17 is shifted from the reference value (0 eV) in a positive direction. When shifted by approximately 0.05 eV from the reference value, an amount of loss of exciton generation efficiency from a maximum value (at approximately 0.3 eV) is reduced by approximately half; and when shifted by approximately 0.1 eV or greater from the reference value, exciton generation efficiency is substantially saturated.

On the other hand, as shown in FIG. 12, applied voltage for supplying a unit of current (10 mA/cm$^2$) gradually decreases as energy level of the light-emitting layer 17 is shifted in a positive direction from the reference value (0 eV), and a minimum value is indicated when shifted 0.15 eV from the reference value. The applied voltage gradually increases as energy level of the light-emitting layer 17 is shifted further in the positive direction, and the applied voltage indicates a value that does not exceed the reference value (0 eV) at approximately 0.3 eV.

From these results it is understood that, when a state not including the electron donor material is a reference value (0 eV), shifting energy level of the light-emitting layer 17 in a positive direction from 0.05 eV to 0.3 eV can improve light emittance efficiency of the organic EL element 1 while reducing drive voltage.

6. Relationship between Shift Amount of Energy Level of the Light-emitting Layer 17 and Carrier Density Calculation was performed of electron donor material doping density for shifting energy level of the light-emitting layer 17 in a positive direction from 0.05 eV to 0.3 eV from a reference value of a state not including the electron donor material. This is described below with reference to the drawings.

When energy level of a typical semiconductor doped with n-type impurities (Fermi level) is Ef and Fermi level of an intrinsic semiconductor is Ei, energy shift amount (Ef−Ei) can generally be calculated by the following formula.

$$Ef-Ei = k\,T\,\ln(Nd/ni) \quad \text{[Math 1]}$$

Here, Ef: Fermi level, Ei: Fermi level of intrinsic semiconductor, k: Boltzmann constant, T: absolute temperature, Nd: n-type carrier density (cm$^{-3}$), ni: intrinsic semiconductor carrier density (cm$^{-3}$).

By using the formula above, the relationship between energy shift amount (Ef−Ei) of the light-emitting layer 17 of the organic EL element 1 and carrier density can be calculated.

Figure 13:
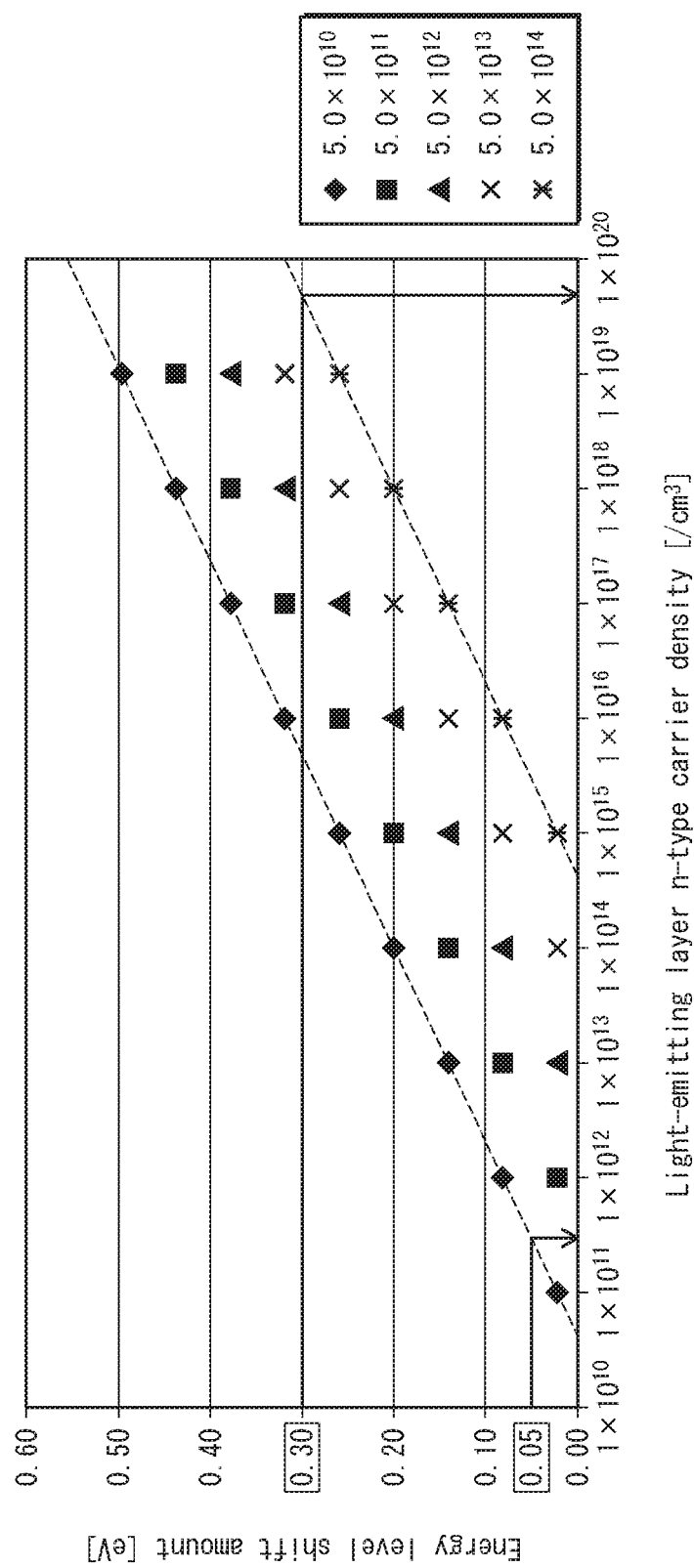
FIG. 13 shows calculation results illustrating a relationship between a shift amount of the energy level of the light-emitting layer and n-type carrier density of the light-emitting layer in the organic EL element 1.

FIG. 13 shows calculation results illustrating a relationship between a shift amount of the energy level of the light-emitting layer and n-type carrier density of the light-emitting layer in the organic EL element 1.

In the present calculation, instead of the carrier density ni of an intrinsic semiconductor, calculation was performed by using carrier density of the light-emitting layer 17 in a state that does not include the electron donor material (the organic light-emitting material layer 17A). Specifically, carrier density of the light-emitting layer 17 in a state that does not include the electron donor material was calculated to be from 5×10$^{10}$/cm$^3$ to 5×10$^{14}$/cm$^3$, which are values calculated by the inventors and obtainable practically. According to FIG. 13, it can be understood that when energy level of the light-emitting layer 17 is shifted in the positive direction from 0.05 eV to 0.3 eV, n-type carrier density of the light-emitting layer 17 is included in a range from 3.5×10$^{11}$/cm$^3$ to 5.5×10$^{19}$/cm$^3$, and preferably in a range from 10$^{12}$/cm$^3$ to 10$^{19}$/cm$^3$. When the electron donor material comprises an alkali metal that is a monovalent ion, the n-type carrier density Nd is a density at which the electron donor material is mixed. When the electron donor material comprises multivalent ions, density of the electron donor material when mixed is calculated from the n-type carrier density Nd according to the valency. For example, when the electron donor material comprises an alkaline earth metal, density of the electron donor material when mixed is ½ of the n-type carrier density Nd.

Figure 14:
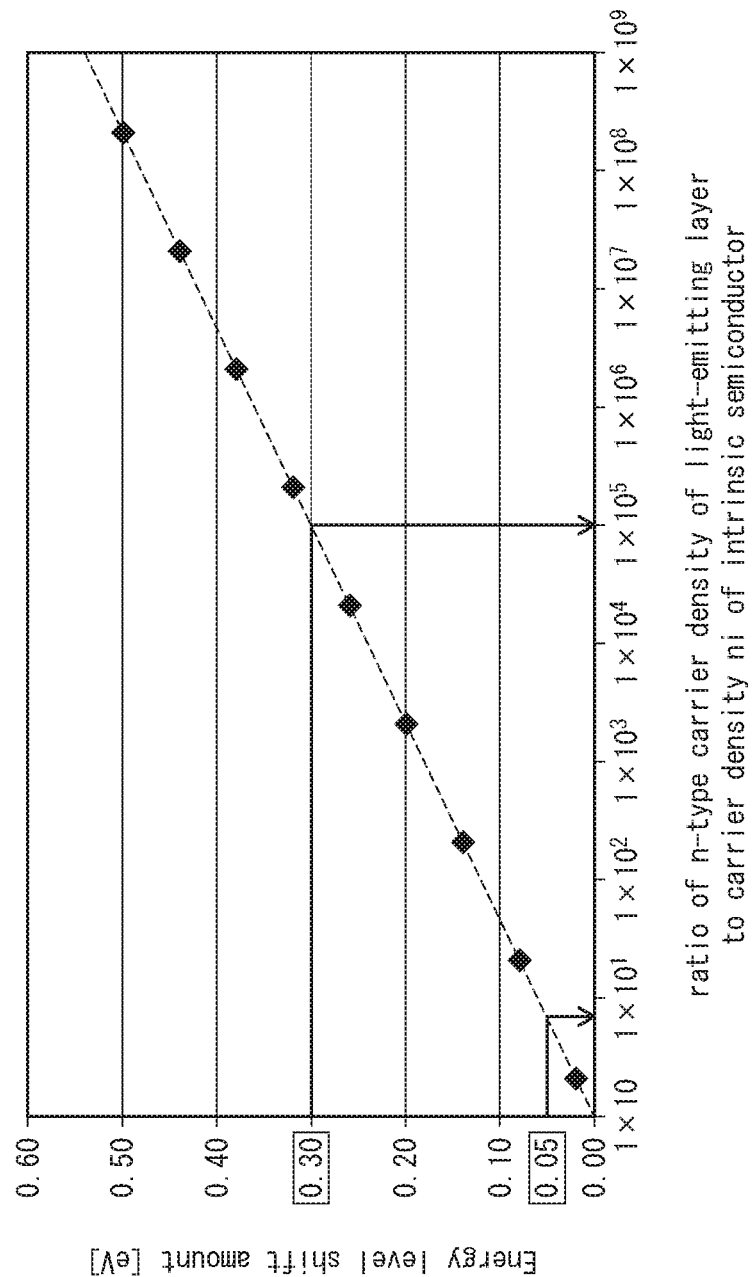
FIG. 14 shows calculation results illustrating a relationship between a shift amount of the energy level of the light-emitting layer, and a ratio of n-type carrier density of the light-emitting layer in the organic EL element 1 to carrier density ni of an intrinsic semiconductor.

Further, using the results of FIG. 13, it is possible to determine the relationship between shift amount of energy level of the light-emitting layer and change rate of n-type carrier density due to addition of the electron donor material to the light-emitting layer. FIG. 14 shows calculation results illustrating a relationship between shift amount of the energy level of the light-emitting layer, and a ratio of n-type carrier density of the light-emitting layer in the organic EL element 1 to carrier density ni of an intrinsic semiconductor. As shown in FIG. 14, in order to shift energy level of the light-emitting layer 17 by 0.05 eV to 0.3 eV in the positive direction, addition of the electron donor material is required so that carrier density of the light-emitting layer 17 increases by seven times to 1×10$^5$ times, preferably 1×10$^1$ times to 1×10$^5$ times, carrier density of the organic light-emitting material in a state in which the electron donor material is not included.

7. Experimental Results of Light Emittance Efficiency and Applied Voltage when Using the Organic EL Element 1

Figure 15A:
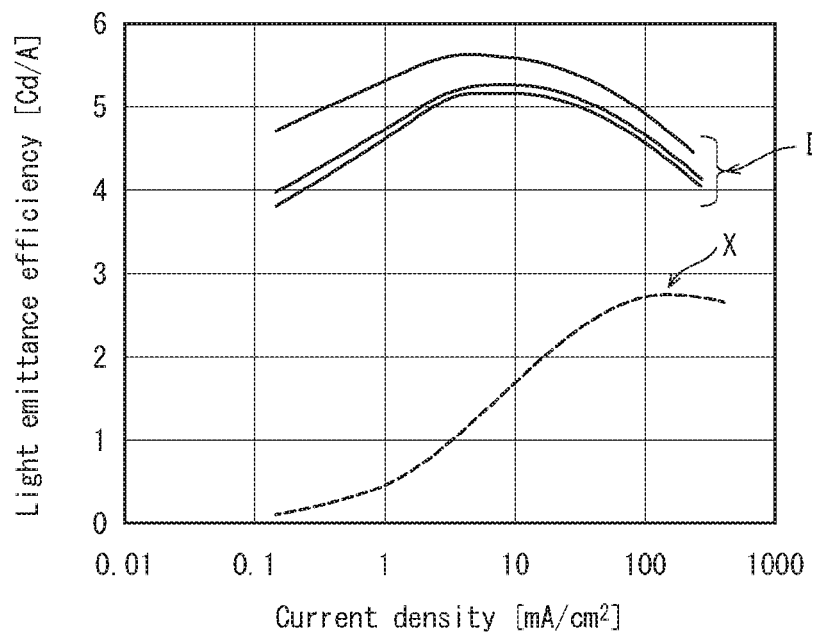
FIG. 15A shows experimental results illustrating a relationship between current density of the light-emitting layer and maximum exciton efficiency, in the organic EL element 1.
Figure 15B:
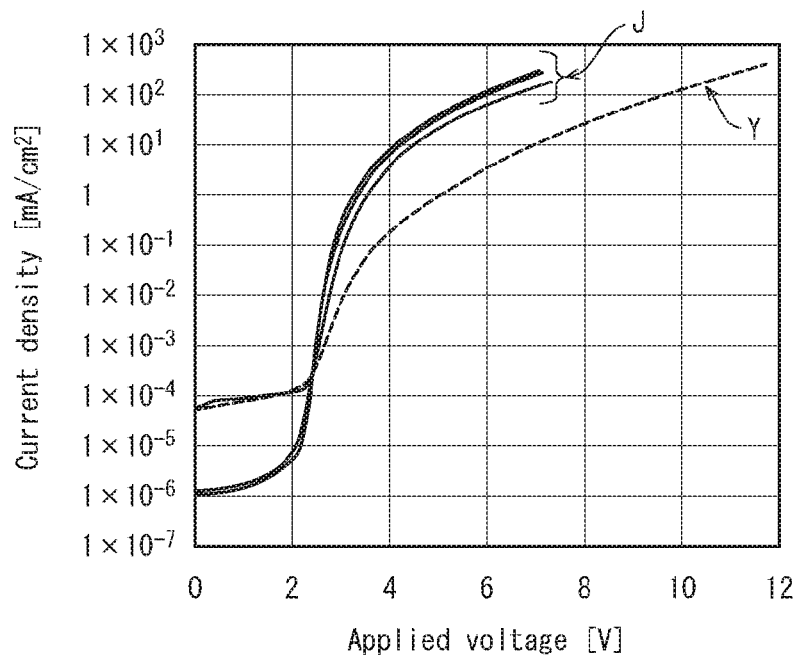
FIG. 15B shows experimental results illustrating a relationship between applied voltage and current density, in the organic EL element 1.

Light emittance efficiency and applied voltage were measured when using samples pertaining to the organic EL element 1. FIG. 15A shows experimental results illustrating a relationship between current density of the light-emitting layer and maximum exciton efficiency, in the organic EL element 1. FIG. 15B shows experimental results illustrating a relationship between applied voltage and current density, in the organic EL element 1. In the samples pertaining to the organic EL element 1, the electron donor material was added to the light-emitting layer 17 so that energy level of the light-emitting layer 17 was shifted by 0.05 eV to 0.3 eV in the positive direction. As a comparative example, a sample in which the light-emitting layer did not include the electron donor material was used.

As shown in FIG. 15A, comparing experimental results shows that, at all current densities, light emittance efficiency of experimental results I (solid lines) according to the samples pertaining to the organic EL element 1 is greater than light emittance efficiency of experimental result X (dashed line) according to the sample pertaining to the comparative example.

Further, as shown in FIG. 15B, at all applied voltages, current density of experimental results J (solid lines) according to the samples pertaining to the organic EL element 1 is greater than current density of experimental result Y (dashed line) according to the sample pertaining to the comparative example.

From the results described above, according to the sample pertaining to the organic EL element 1, in which energy level of the light-emitting layer 17 is shifted 0.05 eV to 0.3 eV in the positive direction from the reference value of a state in which the electron donor material is not included, light emittance efficiency is improved and drive voltage is decreased compared to the sample in which the electron donor material is not included in the light-emitting layer.

8. Summary

As described above, the organic EL element 1 pertaining to the present embodiment comprises: the pixel electrode 13; the first functional layer (15 and 16) disposed above the pixel electrode 13, the first functional layer (15, 16) having at least one property selected from the group consisting of a hole injection property and a hole transport property; the light-emitting layer 17 disposed above the first functional layer (15, 16), the light-emitting layer 17 comprising the organic light-emitting material doped with the electron donor material; the second functional layer 21 disposed above the light-emitting layer 17, the second functional layer 21 having at least one property selected from the group consisting of an electron injection property and an electron transport property; and the opposing electrode 22 disposed above the second functional layer 21, wherein carrier density of the light-emitting layer 17 is from $10^{12}/cm^3$ to $10^{19}/cm^3$. Further, a configuration may be adopted according to which the carrier density of the light-emitting layer 17 is $1 \times 10^1$ to $1 \times 10^5$ times greater than carrier density of the organic light-emitting material prior to the doping with the electron donor material. Further, a configuration may be adopted according to which the carrier density of the light-emitting layer 17 prior to doping with the electron donor material is from $5 \times 10^{10}/cm^3$ to $5 \times 10^{14}/cm^3$, and the electron donor material is alkali metal or alkaline earth metal, preferably lithium or sodium.

According to these configurations, it is possible to balance an amount of electrons supplied for recombination with holes in the light-emitting layer 17 and an amount of holes supplied to the light-emitting layer 17 from the first functional layer (15 and 16). Thus, the organic EL element is provided that increases light emittance efficiency and can be driven at low voltage.

<Modifications>

The above describes the organic EL element 1 pertaining to the embodiment, but the technology pertaining to the present disclosure is not limited to the above embodiment except for its essential characteristic elements. For example, configurations obtained by applying various modifications that may occur to a person having ordinary skill in the art, and configurations implemented by any combination of elements and functions of the embodiment within a scope that does not depart from the spirit of the technology pertaining to the present disclosure are included in the present disclosure. The following describes, as an example of such a configuration, a modification of the organic EL element 1 and the organic EL panel 100.

(1) According to the organic EL element pertaining to the embodiment above, after the forming of the organic light-emitting material layer comprising the organic light-emitting material above the first functional layer, the first intermediate layer 18 is formed above the organic light-emitting material layer, the first intermediate layer 18 comprising a compound, the compound comprising a first metal that is an alkali metal or alkaline earth metal, and the second intermediate layer 19 is formed above the first intermediate layer 18, the second intermediate layer 19 comprising a second metal, the second metal having a property of decomposing a bond between the first metal and another element in the compound. Thus, the first metal is diffused throughout the light-emitting layer 17 as the electron donor material. Methods of forming a configuration in which the first metal is diffused through the light-emitting layer 17 are not limited to the above. For example, after forming the organic light-emitting material layer comprising the organic light-emitting material above the first functional layer, carrier density of the organic light-emitting material layer may be made to be $10^{12}/cm^3$ to $10^{19}/cm^3$ by doping via a method such as ion injection with an alkali metal or alkaline earth metal. Further, the light-emitting layer may be formed above the first functional layer by co-evaporation of an organic light-emitting material and a selected one of the group consisting of an alkali metal and an alkaline earth metal so that the light-emitting layer has a carrier density of $10^{12}/cm3$ to $10^{19}/cm3$. Further, the light-emitting layer may be formed by applying ink by wet processing, the ink containing the organic light-emitting material and a compound, the compound comprising a first metal that is an alkali metal or alkaline earth metal.

(2) According to the embodiment above, the organic EL element 1 is described as comprising the first functional layer that comprises the hole injection layer 15 and the hole transport layer 16, and the second functional layer 21 that comprises the electron transport layer, but the organic EL element 1 is not limited to this configuration. For example, the first functional layer may comprise either of the hole injection layer 15 and the hole transport layer 16, and in a case in which the second functional layer 21 comprises the electron injection layer, the electron injection layer and the electron transport layer may together be considered to be the second functional layer. Further, in a case in which the second functional layer 21 includes the electron injection layer and not the electron transport layer, the electron injection layer may be considered to be the second functional layer. Further, a configuration may be implemented that does not include one or more of the group consisting of the first functional layer and the second functional layer.

(3) The organic EL element 1 may be configured to further include other layers such as a light-transmissive conductive layer.

(4) According to the embodiment above, an example is described using glass as an insulating material of the base material 111 of the organic EL element 1, but the insulating material of the base material 111 is not limited to this example. As the insulating material of the base material 111, resin, ceramic, etc., may be used. As a resin used in the base material 111, insulating material such as polyimide resin, acrylic resin, styrene resin, polycarbonate resin, epoxy resin, polyethersulfone, polyethylene, polyester, silicone resin, etc., may be used. As a ceramic used in the base material 111, material such as alumina may be used.

(5) According to the embodiment above, the pixel electrode 13 is an anode and the opposing electrode 22 is a cathode, but this is just an example. The pixel electrode may be a cathode and the opposing electrode an anode. In such a case, the pixel electrode 13 as an anode and the bank layer 14 are formed above the interlayer insulating layer 12, and the second functional layer 21 and the light-emitting layer 17 are formed above the pixel electrode in the opening 14a. Subsequently, the hole transport layer 16 and the hole injection layer 15 are formed above the elements described above, and the opposing electrode 22 is formed as an anode above the elements described above.

(6) According to the embodiment above, a top-emission type of organic EL panel is indicated, but the present disclosure is not limited to this example and may implement a bottom-emission type. In such a case, the anode layer comprises a light-transmissive material. In the case of top-emission, the opposing electrode 22, as an anode, comprises a light-transmissive material that is conductive such as indium tin oxide (ITO), indium zinc oxide (IZO), etc. The pixel electrode, as a cathode, may comprise a conductive material provided with reflectivity such as Ag, Al, Al alloy, Mo, APC, ARA, MoCr, MoW, NiCr, etc.

Further, in the case of bottom-emission, as the reverse of the above, the opposing electrode 22, as an anode, may comprise a light-transmissive material that is conductive, and the pixel electrode, as a cathode, may comprise a conductive material provided with reflectivity.

(7) According to the embodiment above, as a method of forming the light-emitting layer 17, wet deposition processes such as printing, spin coating, ink jet, etc., are described, but the technology pertaining to the present disclosure is not limited to these examples. For example, dry deposition processes such as vacuum deposition, electron beam deposition, sputtering, reactive sputtering, ion plating, vapor phase growth, etc., may be used.

(8) According to the embodiment above, the organic EL panel 100 is an active matrix type, but the technology pertaining to the present disclosure is not limited to this example and may be, for example, a passive matrix type. Specifically, linear electrodes parallel to a direction of extension of the bank layer and linear electrodes perpendicular to the direction of extension of the bank layer may be arranged in plural to sandwich the light-emitting layer. In such a case, if the linear electrodes perpendicular to the direction of extension of the bank are on a lower side, in each gap, a plurality of lower-side electrodes that are spaced from each other are arranged in the direction of extension of the bank layer, and become one aspect of the technology pertaining to the present disclosure. In such a case, each configuration may be appropriately modified. According to the embodiment above, the substrate 11 has a TFT layer, but for examples such as the passive matrix above, the substrate 11 is not limited to the example having a TFT layer.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

The invention claimed is:

1. A method of manufacturing an organic electroluminescence (EL) element, the method comprising:
    forming an anode;
    forming a bank layer, by pattern exposure, with openings;
    forming a first functional layer above the anode in the openings, the first functional layer having at least one property selected from the group consisting of a hole injection property and a hole transport property;
    forming an organic light-emitting material layer above the first functional layer in the openings, the organic light-emitting material layer comprising an organic light-emitting material;
    forming a first intermediate layer above the organic light-emitting material layer contacting directly a top surface of the bank layer, the first intermediate layer comprising a compound, the compound comprising a first metal that is an alkali metal or alkaline earth metal;
    forming a second intermediate layer above the first intermediate layer, the second intermediate layer comprising a second metal selected from a group consisting of alkali metals and alkaline earth metals, the second metal having a property of decomposing a bond between the first metal and another element in the compound;
    forming a functional layer above the second intermediate layer, the functional layer having at least one property selected from the group consisting of an electron transport property and an electron injection property; and
    forming a cathode above the functional layer, wherein
    the forming of the second intermediate layer results in forming of a light-emitting layer from the organic light-emitting material layer by diffusion of the first metal into the organic light-emitting material layer, carrier density of the light-emitting layer being from $10^{12}/cm^3$ to $10^{19}/cm^3$, and
    the light-emitting layer has a different material composition than the organic light-emitting material layer.

2. The method of claim 1, wherein
the first metal is lithium or sodium.

3. The method of claim 1, wherein
the second metal is barium.

4. The method of claim 1, wherein
the first intermediate layer is formed to have a film thickness of 1 nm to 10 nm.

5. The method of claim 1, wherein
the second intermediate layer is formed to have a film thickness of 0.1 nm to 1 nm.

6. The method of claim 1, wherein
the light-emitting layer is formed after the forming of the organic light-emitting material layer.

7. The method of claim 6, wherein
the light-emitting layer is formed after the forming of the first intermediate layer and the forming of the second intermediate layer.

8. The method of claim 1, wherein
the light-emitting layer includes the first metal as an electron donor material, and the organic light-emitting material layer does not include the electron donor material.

* * * * *